US006850064B1

(12) United States Patent
Srinivasan (10) Patent No.: US 6,850,064 B1
(45) Date of Patent: Feb. 1, 2005

(54) RADIO-FREQUENCY COIL ARRAY FOR RESONANCE IMAGING ANALYSIS

(75) Inventor: Ravi Srinivasan, Cleveland Heights, OH (US)

(73) Assignee: Advanced Imaging Research, Inc., Cleveland, OH (US)

( * ) Notice: Subject to any disclaimer, the term of this patent is extended or adjusted under 35 U.S.C. 154(b) by 0 days.

(21) Appl. No.: 09/721,249

(22) Filed: Nov. 22, 2000

Related U.S. Application Data (60) Provisional application No. 60/167,498, filed on Nov. 24, 1999.

(51) Int. Cl.[7] .................................................. G01V 3/00
(52) U.S. Cl. ....................................... 324/318; 324/322
(58) Field of Search ............................... 324/318, 309, 324/322, 307, 320

(56) References Cited

U.S. PATENT DOCUMENTS

| | | | | |
|---|---|---|---|---|
| 4,694,255 A | * | 9/1987 | Hayes .......................... 324/318 |
| 5,194,811 A | * | 3/1993 | Murphy-Boesch et al. . 324/322 |
| 5,602,479 A | * | 2/1997 | Srinivasan et al. .......... 324/318 |
| 5,680,047 A | * | 10/1997 | Srinivasan et al. .......... 324/318 |
| 5,682,098 A | * | 10/1997 | Vij ............................... 324/318 |
| 5,757,189 A | * | 5/1998 | Molyneaux et al. ........ 324/318 |
| 5,777,474 A | * | 7/1998 | Srinivasan ................... 324/318 |
| 5,999,000 A | * | 12/1999 | Srinivasan ................... 324/318 |
| 6,150,816 A | * | 11/2000 | Srinivasan ................... 324/318 |
| 6,177,797 B1 | * | 1/2001 | Srinivasan ................... 324/318 |
| 6,285,189 B1 | * | 9/2001 | Wong ........................... 324/318 |

FOREIGN PATENT DOCUMENTS

WO      WO98/37438     *   8/1998

* cited by examiner

*Primary Examiner*—Christopher W. Fulton
*Assistant Examiner*—Tiffany A. Fetzner
(74) *Attorney, Agent, or Firm*—Renner, Otto, Boisselle & Sklar, LLP (57) ABSTRACT

An RF coil array is provided with increased S/N over the entire imaging FOV. The array design includes a first RF coil spanning the entire FOV, second and third RF coils which together span the entire FOV such that the entire system provides improved S/N over the imaging FOV. An aspect of the invention is the unusual combination of coils in one integrated structure, that are well isolated from one another and maintain preferred current distributions and mode orientations.

36 Claims, 12 Drawing Sheets

RADIO-FREQUENCY COIL ARRAY FOR RESONANCE IMAGING ANALYSIS

CROSS REFERENCE TO RELATED APPLICATIONS

This Application claims priority from U.S. Provisional Application Ser. No. 60/167,498 filed Nov. 24, 1999, which is incorporated herein by reference.

TECHNICAL FIELD

The present invention relates to resonance systems, such as magnetic resonance imaging (MRI), nuclear quadrupole resonance (NQR), electron spin resonance (ESR) systems. More particularly, the present invention relates to a radio-frequency (RF) coil array and method for use in such systems. This application is based on provisional application No. 60/167,498, filed Nov. 24, 1999, the entire disclosure of which is incorporated herein by reference.

BACKGROUND OF THE INVENTION

NMR or MRI

In MRI systems or nuclear magnetic resonance (NMR) systems, a static magnetic field $B_0$ is applied to the body under investigation to define an equilibrium axis of magnetic alignment in the region of the body under investigation. An RF field is applied in the region being examined in a direction orthogonal to the static field direction, to excite magnetic resonance in the region, and resulting RF signals are detected and processed. Generally, the resulting RF signals are detected by RF coil arrangements placed close to the body. See, for example, U.S. Pat. No. 4,411,270 to Damadian and U.S. Pat. No. 4,793,356 to Misic et al. Typically, such RF coils are either surface type coils or volume type coils, depending on the particular application. Normally separate RF coils are used for excitation and detection, but the same coil or array of coils may be used for both purposes.

Generally, solenoid, saddle or Alderman-Grant (see, e.g., Alderman, D. W. and Grant, D. M. J. Magn. Reson. 36:447 (1979)) type linear volume RF coils were used for NMR imaging. A further increase in S/N can be realized with the use of quadrature coils over the conventional linear coil designs. See, for example, U.S. Pat. No. 4,467,282 to Siebold and U.S. Pat. No. 4,707,664 to Fehn; see also, U.S. Pat. No. 4,783,641 to Hayes and U.S. Pat. No. 4,751,464 to Bridges, for highly homogeneous, quadrature volume coils commonly referred to as the birdcage and transverse electromagnetic wave (TEM) resonators respectively, in the NMR community. A four-ring birdcage of Murphy-Boesch (see, e.g., U.S. Pat. No. 5,21,450) was introduced to further improve the S/N and B field uniformity along the coil axis.

The recent introduction of phased array radar and ultrasound technology to NMR by Roemer (see, e.g., U.S. Pat. No. 4,825,162) has allowed the use of multiple RF coils in an effort to increase image S/N and resolution. It is noted that multiple RF coils arranged in unique configurations can be used to reduce the time spent by the patient inside the MR scanner. This is extremely useful in reducing patient claustrophobia and discomfort. This aspect is also useful in increasing patient throughput in a MR scanner. U.S. Pat. No. 5,258,717 to Misic and U.S. Pat. No. 5,646,531 to Renz applied the above array concept to further enhance S/N of the volume birdcage coil. A novel technique was introduced by Wang [7] to reduce the coupling between neighboring surface coils in an effort to maximize overall S/N. (See, e.g., Wang, Jianmin. "A Novel Method to Reduce the Signal Coupling of Surface Coils for MRI", ISMRM $4^{th}$ Scientific Meeting, Book of Abstracts, page 1434, 1996). More recently, SMASH and SENSE were introduced to further enhance the S/N and imaging resolution and reduce the scan time. These techniques mandate the use of multiple coils in an array configuration over the imaging FOV. (See, e.g., Klaas P. Pruessmann, et al., "SENSE: Sensitivity Encoding for Fast MRI", Magnetic Resonance in Medicine 42:952–962 (1999), and Sodickson D K, et al., "Simultaneous acquisition of spatial harmonics (SMASH); ultra-fast imaging with radio-frequency coil arrays", Magnetic Resonance in Medicine 1997; 38:591–603).

A strong need met by the present invention is to enhance further the signal-to-noise (S/N) of an RF coil receiver system, which will make it possible to obtain higher resolution images needed for accurate diagnosis. With the improved S/N, one can reduce the scan time thereby reduce patient discomfort and concomitantly increase patient throughput in a MR scanner. Conventional coils may be summarized as follows:

Solenoid

Figure 10:
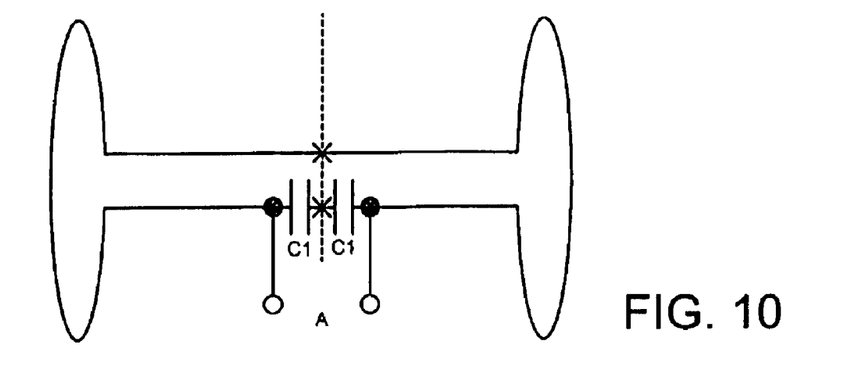
FIG. 10 is a schematic view of a two turn solenoid coil.

The solenoid RF coil looks very similar to that of the conventional solenoid. A two turn solenoid RF coil with two identical value C1 tuning capacitors in series is shown in FIG. 10. The inductance of the coil turns along with C1 resonate the coil near the NMR frequency. By adjusting the tuning capacitors C1 and matching the coil across C1 (A) with impedance matching networks (not shown), one can derive the homogeneous mode which can be used to image at the NMR frequency. The B field orientation of this homogeneous mode is along the coil axis, in the Z direction. The points where the dotted line intersects the coil are at virtual ground, they have no net potential (shown with"x" marks).

Alderman-Grant Design

Figure 11:
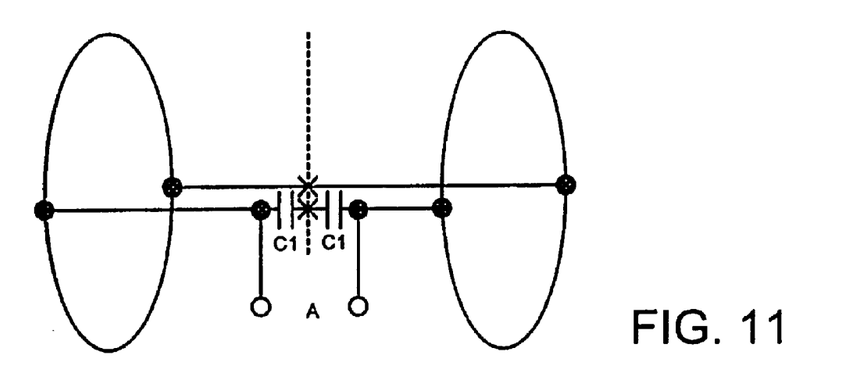
FIG. 11 is a schematic view of an Alderman-Grant type resonator.

A simple schematic of a Alderman-Grant type resonator is shown in FIG. 11. The coil consists of two end rings connected by two straight segments. Tuning was accomplished with C1 whereas, matching was accomplished across C1 (A) with impedance networks (not shown) similar to the solenoid explained above. Here currents in the two end rings were 180 degrees out-of-phase. Useful mode for NMR imaging was oriented along the Y axis. This design was suited for cylindrical volumetric applications, e.g., imaging the human head, whole body, knee, wrist etc.

For the symmetric coil of FIG. 11, the virtual ground plane existed in the central transverse plane at the coil center (see dotted line of FIG. 11). The points where the dotted line intercepted the straight segments were at virtual ground, that is these two points (shown with x) had no net potential.

TEM Resonator

Figure 12:
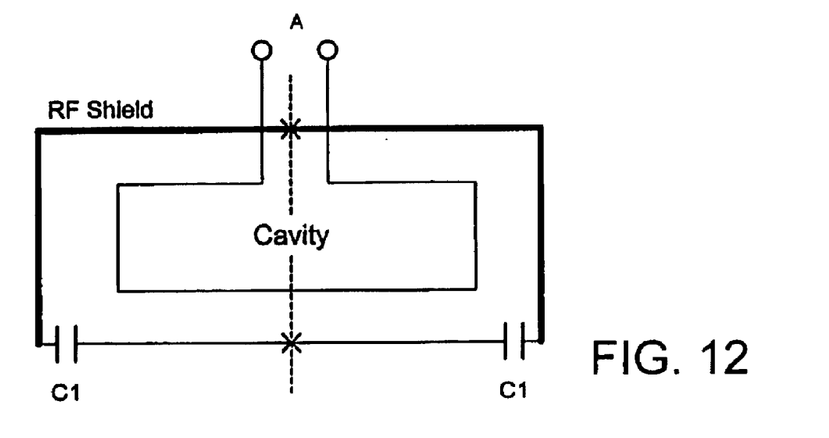
FIG. 12 is a schematic view of a single cavity section of a TEM resonator.

An extension of the cavity resonator well suited for volumetric NMR imaging applications is the transmission line TEM resonator of Bridges. (See, e.g., James F. Bridges. "Cavity Resonator with Improved Magnetic Field Uniformity for High Frequency Operation for High Frequency Operation and Reduced Dielectric Heating in NMR Imaging Devices", U.S. Pat. No. 4,751,464, dated Jun. 14, 1988, and specifically FIG. 1 thereof). This design consisted of a number of transmission line segments originating and terminating on a common shield, which served as a ground and cavity wherein all of the flux was contained. A TEM section is shown in the present application in FIG. 12. The dark section depicts the RF shield and the region between the straight segment and the closed shield encompasses a cavity. The cavity was resonant with C1. Coupling to the cavity resonator can be accomplished with inductive pickup loops, one such rectangular loop is shown in FIG. 12. A total of two such loops may be used to drive the coil in quadrature. See the aforementioned reference U.S. Pat. No. 4,751,464 for details on the coupling and drive mechanisms for the TEM resonator.

For a symmetric cavity of FIG. 12, the central point of the transmission line segment i.e., the point where the dotted line intercepted the straight segment was at no net potential. Such was the case for the central points of all of the transmission line segments, they were at virtual ground. Thus the virtual ground plane for the symmetric cavity resonator was located in the central transverse plane (entire cavity resonator not shown).

It is noted for the above case of the solenoid, Alderman-Grant and TEM resonators, details of the coupling and driving mechanisms are not shown. It is hereby envisaged that those skilled in the art can easily understand and successfully build these designs by reading RF coil articles mentioned in the references.

Birdcage

Figure 1A:
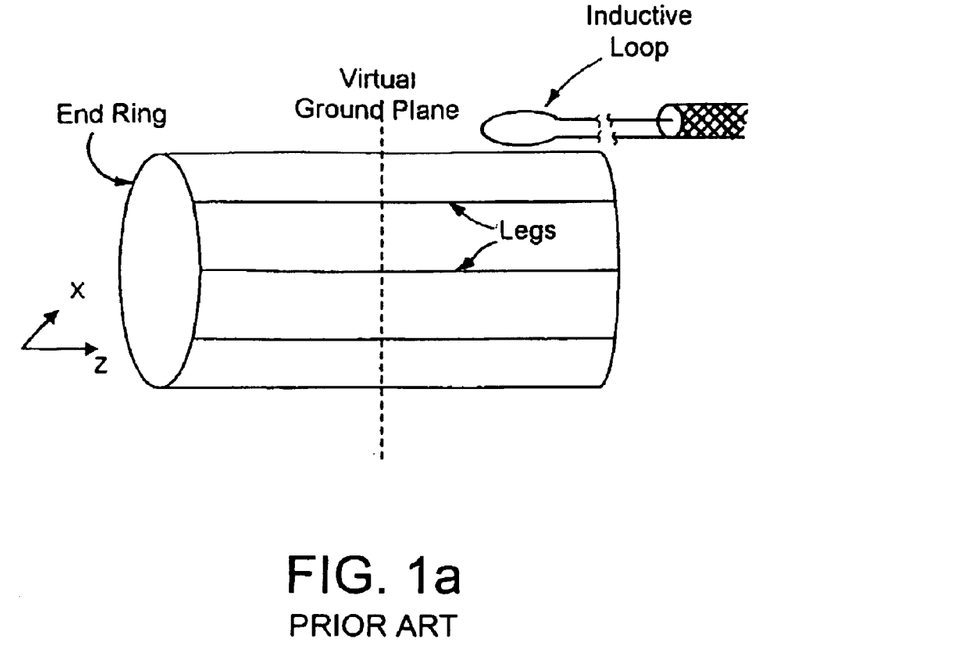
FIG. 1a is a schematic view of a birdcage coil.

The birdcage coil is well known in the art and is shown in FIG. 1a. The coil comprises of two rings connected by several straight segments referred to as legs. This coil has several resonance modes, of interest is the principal k=1 mode for homogeneous imaging. The principal mode has two linear modes, oriented orthogonal to one another. The outputs from these modes can be combined using analog circuitry or digitally combined in the receiver system. The birdcage provided a 41% improvement in S/N and expended one-half the power over the conventional linear coil.

Figure 1B:
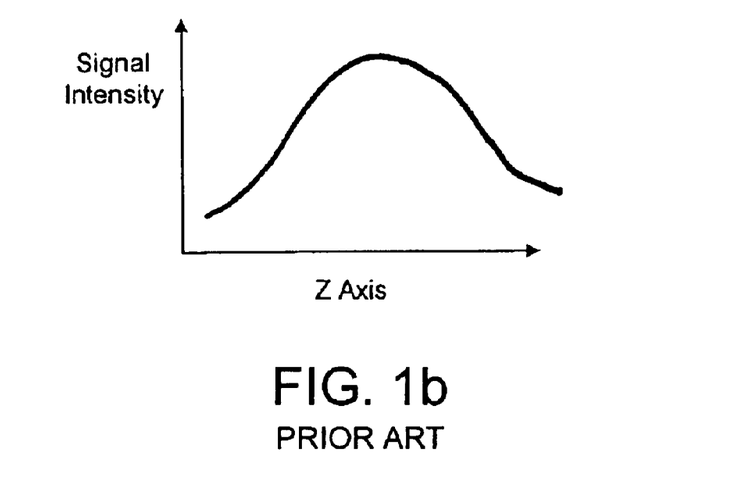
FIG. 1b represents the B field profile of the birdcage coil of FIG. 1a along the coil axis.

In addition, owing to the sinusoidal currents in the coil periphery the birdcage provided a highly homogeneous B field in the transverse planes (XY) inside the coil, ideal for volume imaging (whole-body, head, knee, wrist, etc.). The B field profile along the coil axis however mimicked a gaussian distribution, with maximum at the coil center. See FIG. 1b. Note, the birdcage can be designed to operate in the low-pass, high-pass, band-pass or band-stop configurations.

The dotted line of FIG. 1a is the virtual ground plane for this symmetric birdcage. The points where this plane intersects the coil legs are at virtual ground, that is at no net potential. For a birdcage with eight fold symmetry, the points of virtual ground are at the center of the legs. This can be evidenced by a finger touch method, the tuning and matching of the coil will remain virtually unaltered.

For a complete theory of the birdcage, reference is made to Tropp, James, "The Theory of the Birdcage Resonator", Journal of Magnetic Resonance 82, 51–62, 1989. For different methods of coupling to the birdcage, see U.S. Pat. No. 4,887,039 to Roemer. An alternative coupling method using a series tuned inductive loop is shown in FIG. 1a. Normally, two such loops are needed to drive the two principal linear modes that are oriented orthogonal to one another.

Four-Ring Birdcage

Figure 2A:
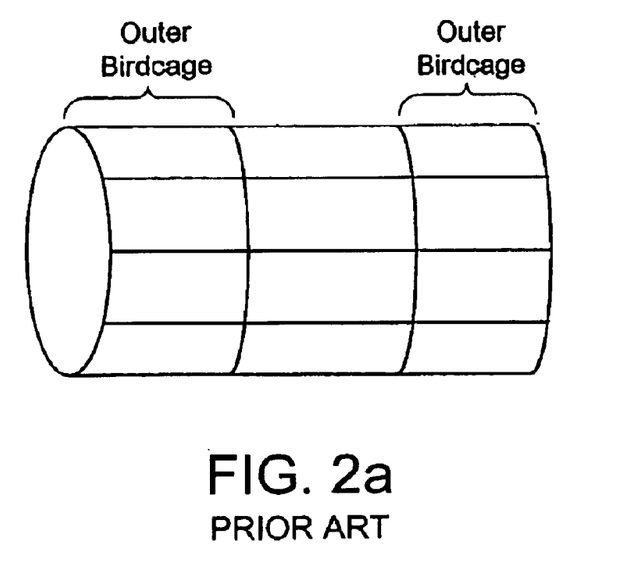
FIG. 2a is a schematic view of a four-ring birdcage coil.
Figure 2B:
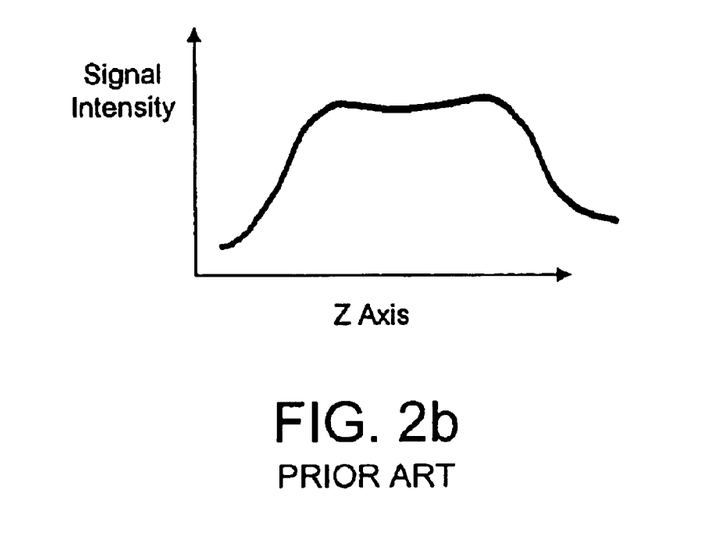
FIG. 2b represents the B field profile of the four-ring birdcage coil of FIG. 2a along the coil axis.

The four-ring of Murphy-Boesch was introduced to improve the S/N and RF homogeneity of the birdcage along the coil axis. Here, two outer birdcages were coupled to each other via interconnecting segments as represented in FIG. 2a. Since a large fraction of currents traversed the inner interconnecting segments, a homogeneous B field distribution was realized along the coil axis. However, little or no S/N improvement was seen at the coil center as represented in FIG. 2b.

Figure 3A:
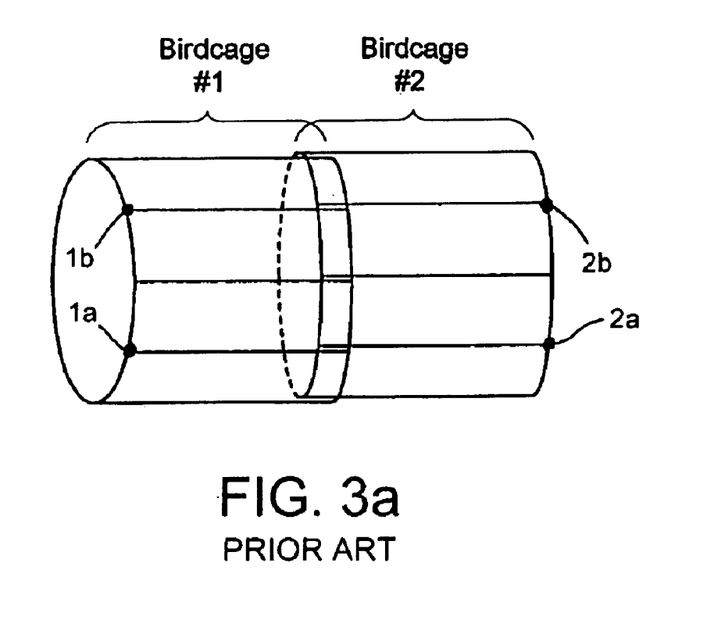
FIG. 3a is a schematic view of a two birdcage array.
Figure 3B:
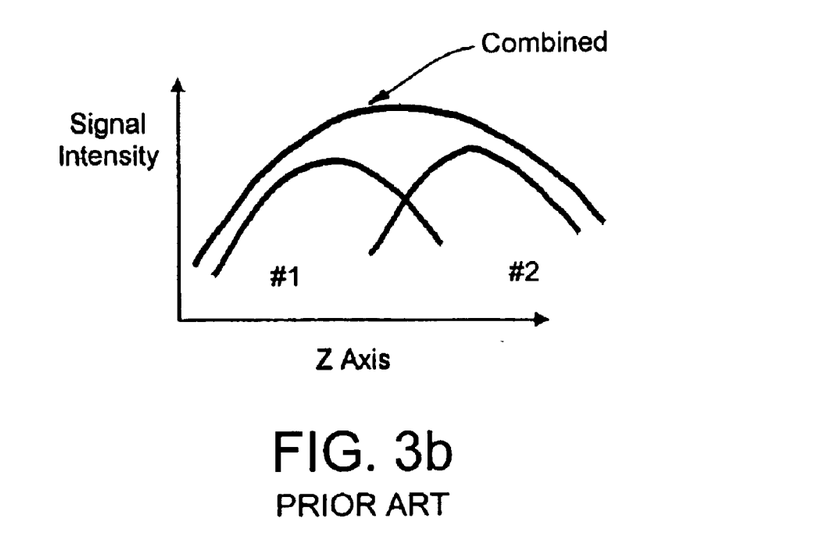
FIG. 3b represents the B field profile of the two birdcage array of FIG. 3a along the coil axis.

2 Birdcage Array The two birdcage array of Misic addressed this deficit to an extent as represented in FIG. 3a. Here, two birdcages placed sequentially were partially overlapped to cancel their net mutual flux coupling. Individual modes from the two coils were routed to separate channels of the MR system. The coil system provided some improvement in S/N at the coil overlap and over the imaging field-of-view (FOV). This coil setup also displays a guassian style B field profile along the coil axis as shown in FIG. 3b.

3 Birdcage Array

Figure 4A:
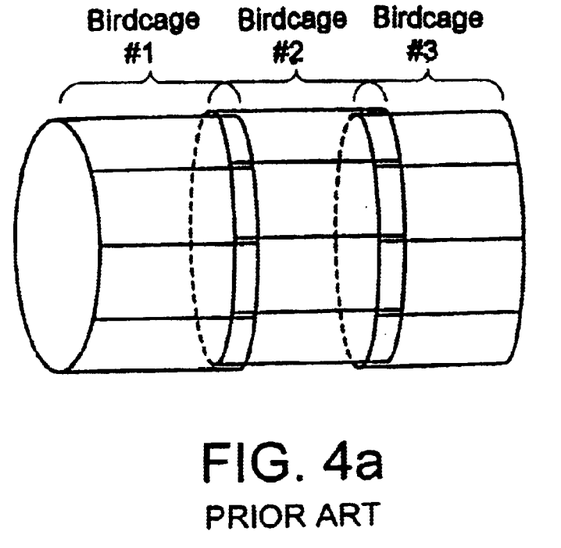
FIG. 4a is a schematic view of a three quadrature birdcage array.
Figure 4B:
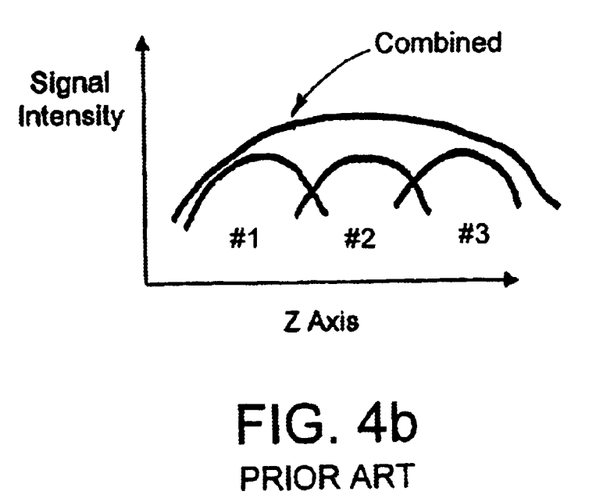
FIG. 4b represents the B field profile of the three quadrature birdcage array along the coil axis.

Likewise in the array design of Renz, three quadrature birdcage coils were overlapped to cancel the net mutual flux as represented in FIGS. 4a and 4b. This array system also provided improved S/N at the coil overlap with some improvement over the imaging FOV.

It is noted when overlapping neighboring volume coils fine coil movement adjustments are necessary to achieve critical coupling, where the net mutual flux coupling between coils is set very close to zero. In addition, canceling the coupling between the co-linear modes in the neighboring birdcages in this fashion, does not satisfy the critical coupling for orthogonal modes in neighboring coils. That is in the case of the two birdcages as represented in FIG. 3a, achieving critical coupling between 1a and 2a (or between 1b and 2b) does not satisfy the criteria for critical coupling between 1a and 2b (or between 1b and 2a). Additional circuitry or mechanisms are warranted to rectify this situation. Misic utilized a complicated design scheme, which was cumbersome to optimize individual coils in the array (mode tuning, matching, alignment and isolation) which in turn made manufacturing an arduous process.

Accordingly, a strong need met by the present invention is an RF coil system, wherein significant S/N improvements can be achieved over the entire FOV. Further, the present invention provides a coil system that can be manufactured with relative ease when compared to geometrically isolated volume coils.

Note, the above volume coil designs (solenoid, saddle, Alderman-Grant, TEM, birdcage) were routinely used in MRI. The features of the present invention can be readily applied to the above and other volume coils designs (such as other cavity and non-cavity designs, counter-rotating coil CRC pair, helmholtz pair, saddle, etc.).

SUMMARY OF THE INVENTION

The present invention provides an RF coil array with improved signal-to-noise ratio (S/N) capable of high resolution imaging over the target field-of-view (FOV). The present invention is suitable to reduce the scan times and therefore to further reduce patient discomfort. In accordance with the present invention, a coil is provided which is capable of operating in different modes in one or more frequencies. Moreover, the present invention simplifies the coil construction and its optimization for relative ease of manufacturing.

It is a primary object of the present invention to further improve the signal-to-noise ratio (S/N) of the resonance imaging RF coil sub-system. Another object is to provide a concept of concurrently imaging with the homogenous and RF gradient modes oriented along the coil axis. Another object is to obviate the need for isolating coils geometrically. A further object is to simplify the coil optimization process and provide a coil system that is relatively easy to manufacture.

The present invention is directed to a integrated RF coil sub-system, intended to provide increased S/N over the entire imaging FOV. The array design includes a first RF coil spanning the entire FOV, second and third RF coils that together span the entire FOV such that the entire system provides improved S/N over the imaging FOV. An aspect of the invention is the unusual combination of coils in one integrated structure, that are well isolated from one another and maintain preferred current distributions and mode orientations.

In the embodiments of the present invention, the first coil has a FOV nearly identical to that of the combined FOV of the second and third RF coils, and overlaps the combined FOV of the second and third coil, such that S/N of all three coils combined is greater than the first coil or greater than the combination of second and third RF coils alone over the imaging FOV. The etched printed circuit design will tremendously ease the coil optimization process when compared to geometrically overlapped coils.

The RF coil system of the embodiments are designed to image many anatomical regions of the human body such as the torso, head, knee, wrist etc.

Figure 6A:
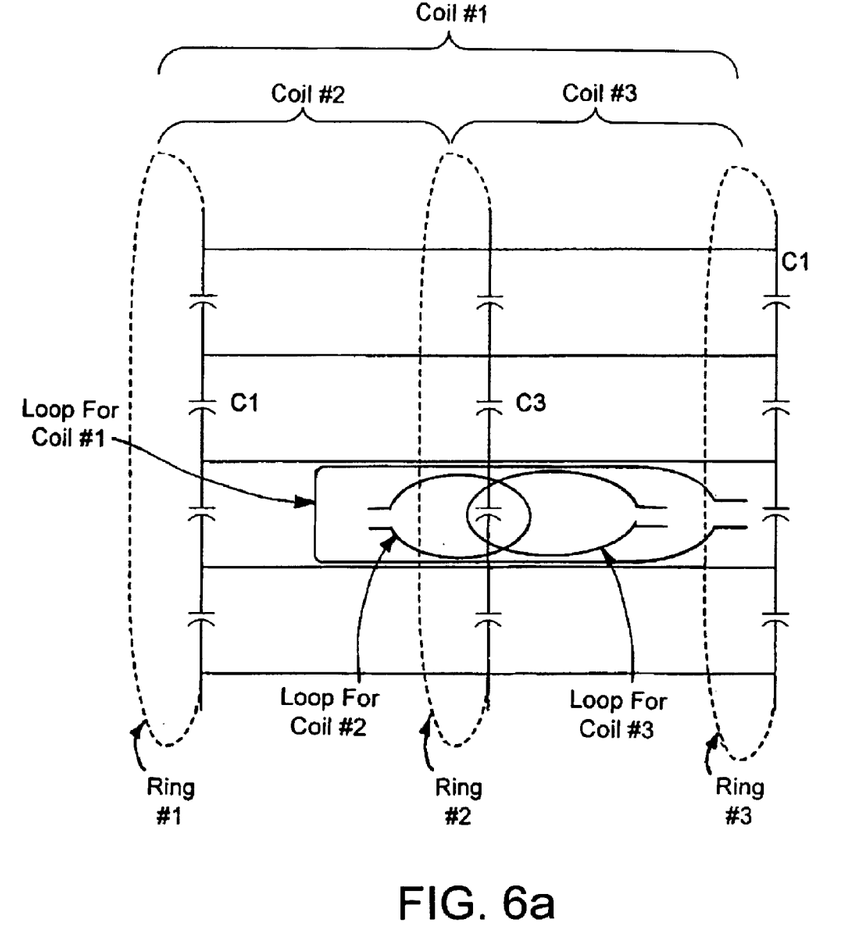
FIG. 6a is a schematic view of a birdcage coil in accordance with the present invention.

According to one particular aspect of the invention, the provision of more than one coil spanning near identical B fields over the entire FOV is introduced. For example, a larger coil #1 and combined coils #2 & #3 span a near identical B field over the imaging FOV. (See, e.g., FIG. 6). In the case of the prior art, the entire FOV is covered by independent RF coils geometrically isolated from one another and arranged in a sequential fashion. In the present invention, two smaller coils #2 & #3 are sequentially arranged, but their effective combined coverage is nearly identical to that of the large coil #1 in the array. Such operation is not achieved by the noted prior art. It is noted that RF coils spanning identical FOVs that are well isolated from one another generally result in enhanced S/N, which is beneficial for imaging.

The present invention further relates to the aspect of imaging with both the homogeneous modes and the radio-frequency (RF) gradient mode, more specifically the RF gradient mode oriented along the coil axis is introduced. Several advantages are realized, for example: a) additional S/N along the coil axis away from the coil center; b) more uniform B field along coil axis; c) shorter coil with enhanced S/N without significantly compromising the B field uniformity when compared to the conventional counterpart; d) steeper rolling off of the B field along the coil axis toward the coil ends, which helps maintain a crisp or sharp FOV coverage over the anatomy. As a particular example, signal contributions from the lower neck, upper chest and shoulders are not sought while scanning the human brain. In such case, a coil with rapid fall off is best suited, so unwanted signal artifacts from the neighboring anatomies can be virtually eliminated.

Additionally, the present invention relates to the aspect of isolating coils relatively easily between a set of volume coils. Maintaining good isolation between coils (to less than −20 dB) will maximize combined S/N. Further, the use of an integrated structure will ease the manufacturing process as this will obviate the need for precise geometric positioning needed to cancel the net mutual flux between coils which to-date remains an arduous process.

Figure 7A:
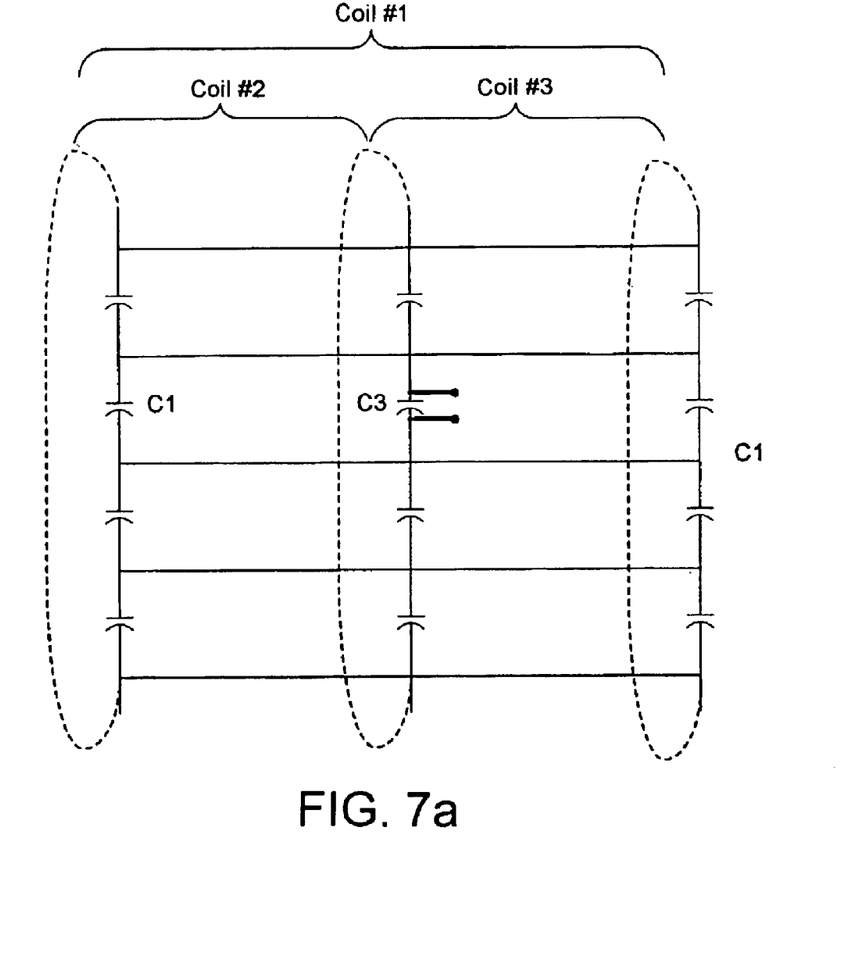
FIG. 7a is a schematic view of another embodiment of a coil in accordance with the present invention.
Figure 8A:
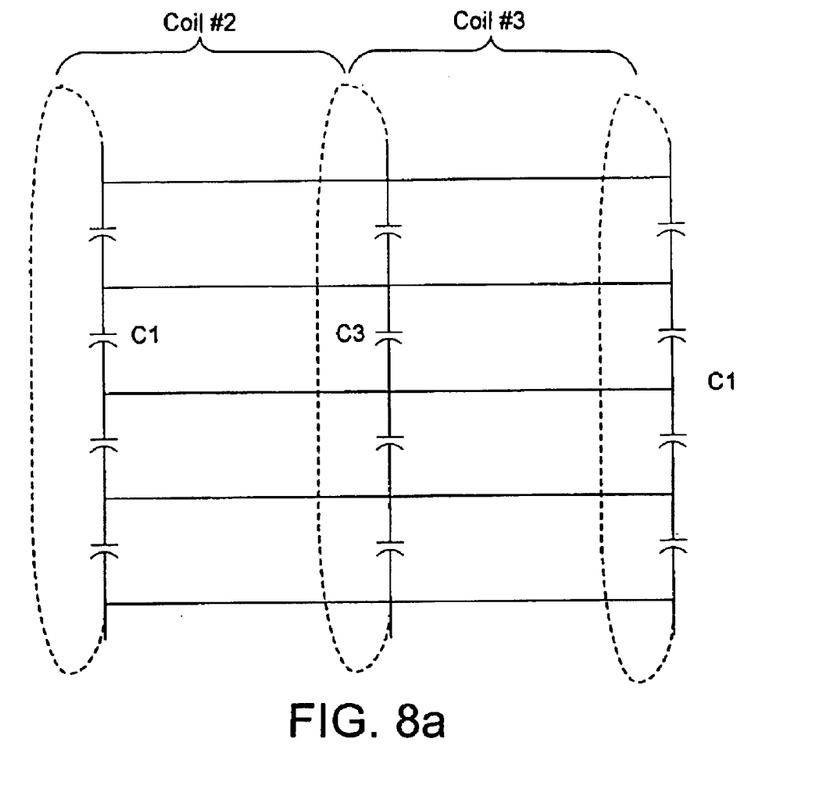
FIG. 8a is a schematic view of another embodiment of a coil in accordance with the present invention.

The present invention also addresses the aspect of connecting the virtual ground points of a RF coil to create a new RF coil array. The array can be designed to operate in multiple modes. As an example for the birdcage, this could be: a) a three coil array (FIG. 6); b) a two coil array with one homogeneous and one RF gradient mode (FIG. 7); or c) a sequentially located two coil array covering neighboring volumes (FIG. 8).

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 7b schematically illustrates a loop combination for driving the coil of FIG. 7a;

DESCRIPTION OF THE PREFERRED EMBODIMENT

The present invention will now be described with reference to the figures.

Figure 5:
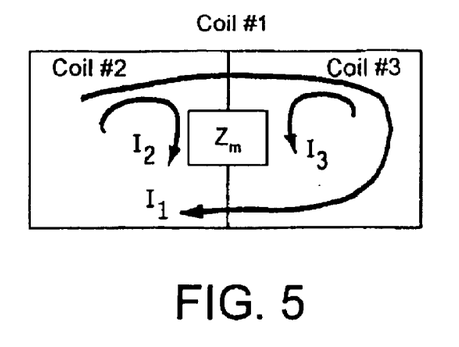
FIG. 5 schematically represents a basic three coil arrangement in accordance with the present invention.

Referring initially to FIG. 5, the present invention preferably includes three coils that are interconnected in a unique fashion in one integrated structure. In FIG. 5, only coil outlines are shown for sake of brevity. Here, the second and third coils are identical in dimension. They share a common coil path which has reactive elements ($Z_m$). Note, the values for ($Z_m$) can be chosen so as to cancel the coupling between them.

All three coils are connected in such a way that the first coil spans an identical FOV of the combined second and third coils. Further, the design is such that when the second and third coils are driven using equal amplitudes with currents 180 degrees out-of-phase, no power will be coupled to the first coil. In this situation, currents injected by the second and third coils in to the first coil will cancel each other resulting in no net current flow in the first coil. Thus all three coils are well isolated from one another and maintain preferred current distributions and mode orientations. Improved coil isolation will result in enhanced combined S/N.

In the three preferred modes of operation for the general principle of FIG. 5, all three coils can be used to image simultaneously independent of one another or the first and the combined second and third coils can be used to image or the second and third RF coils alone can be used for MRI imaging. Further it is also possible that individual coils can be used for imaging.

An adaptation of the preferred embodiment of FIG. 5 for the birdcage is shown on FIG. 6. As seen from FIG. 6a, the first long birdcage is comprised of rings #1 and #2 interconnected by several legs. The coil is resonant with C1 value capacitors. Likewise, the second and third short birdcages that are between rings #1 & #3 and between #3 and #2, respectively are resonant with C1 and C3 value capacitors. All three birdcages (long #1, short #2 & #3) are of the high-pass configuration.

Isolation Between Short Birdcages #2 & #3

Following the work of Wang, the second and third birdcages are isolated from one another. The value of C3 in the inner ring is chosen so as to cancel the mutual coupling between the second and third birdcage. It is noted that doing this takes in to account the orthogonal mode isolation between neighboring coils as opposed to the geometrical overlapping case discussed above (for Misic and Renz)

Following this, the k=1 linear modes of the short birdcages (#2, #3) are tuned and matched to 50 ohms at the NMR frequency. Likewise, the k=1 linear modes of the large birdcage #1 are tuned to the NMR frequency.

Isolation Between Birdcages #2, #3 and Long Birdcage #1

The two short birdcages #2 & #3 will not couple to the long birdcage as long as they are driven with equal amplitudes 180 degrees out-of-phase, which is the case. This condition will inject currents with opposite polarity in to the large birdcage which will cancel out, with no net current flow through it. Thus all three coils are well isolated from one another. Thus, they maintain their individual current distributions and mode orientations. Note in the preferred embodiment, coils #2 & #3 are identical in dimension and roughly one half the length of coil #1. Thus central ring #2 shared by coils #2 & #3 falls exactly over the central virtual ground plane for coil #1, hence will be invisible to the longer coil #1.

Figure 6B:
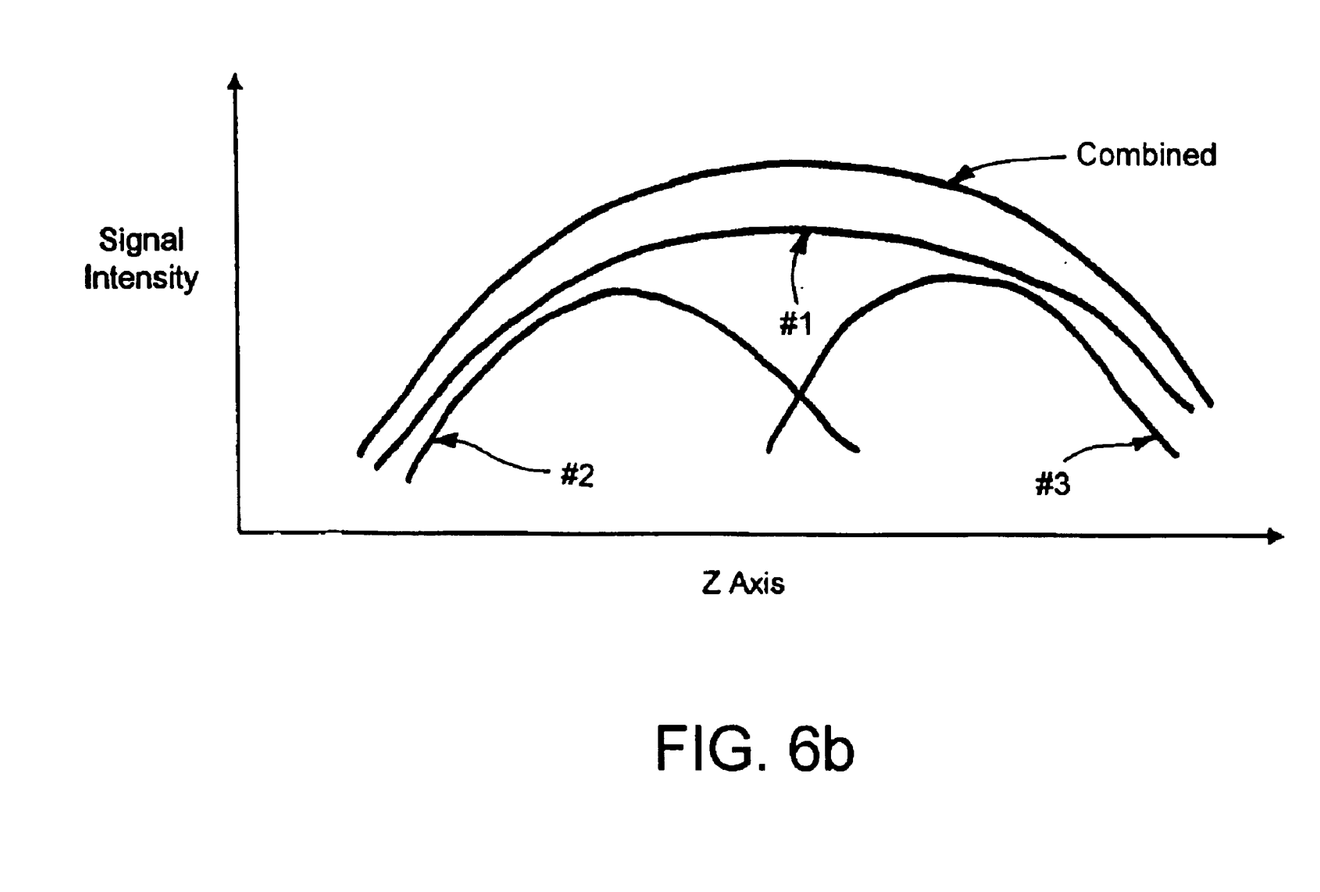
FIG. 6b represents the B field profile of the birdcage coil of FIG. 6a along the coil axis.

The individual modes of the long birdcage #1 and two short birdcages #2 & #3 can be coupled capacitively or inductively similar to that for the conventional birdcage. Altogether six outputs from the three quadrature birdcages can be interfaced to six channels of the MR system receiver (two channels per quadrature birdcage). The shorter birdcages #2 & #3 exhibit gaussian profiles (along the coil axis) which are partially overlapped when combined provide coverage over the entire FOV. This in turn when overlapped with yet another gaussian profile from the longer birdcage #1 spanning the entire FOV, provide increased S/N (as the combined coils #2 & #3 do not interact with the large coil #1) and uniform coverage over the entire FOV. See FIG. 6b representing the B field profile along the coil axis.

It is noted that in the above cases (FIGS. 5 and 6), the short coils #2 & #3 are identical in dimension which is the preferred embodiment. Nevertheless, the array design lends itself to non identical short coils as well, wherein the impedances in the individual short coils (#2, #3) can be altered such that equal amplitude 180 degrees out-of-phase currents are injected in to the larger coil by the two short coils with no net flow in the large coil #1.

All three coils can be driven similar to the inductive coupling method of FIG. 1a. One such set up for the preferred embodiment is shown in FIG. 6a. Inductive coupling loops for coils #2 & #3 must be overlapped to cancel their net mutual flux between them. The two smaller loop set up can be overlapped with the large inductive coupling loop for birdcage #1 in such a way that there is minimal cross-talk between all three coupling loops. Two such (3 loop) set ups are necessary for driving the six linear modes for the array.

Second Embodiment

A second embodiment is wherein the longer birdcage #1 is driven in the conventional manner using capacitive or inductive coupling (similar to that of FIG. 1a) and the combined coils #2 & #3 are driven in the middle, across C3 in ring #3. See FIG. 7a. Driving the combined coil #2 & #3 in the above manner generates a RF gradient mode along the coil axis (in this case along the Z axis) which could also be used to image. Note, the Z RF gradient mode is in quadrature. That is, there exists two linear Z RF gradient modes orthogonal to one another.

Figure 7B:
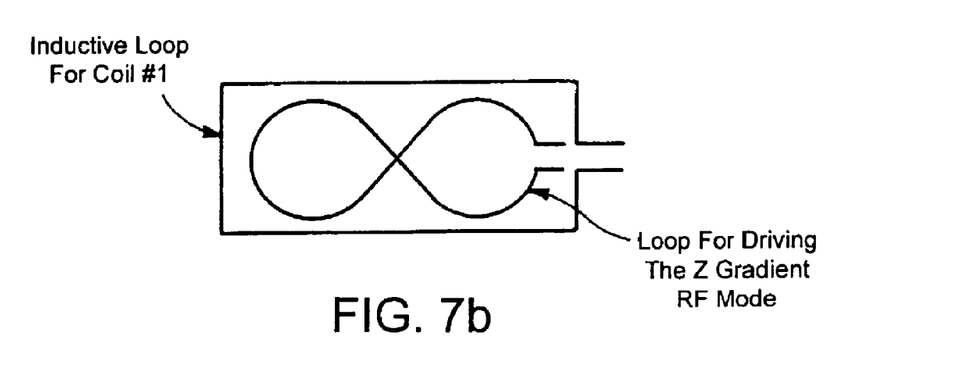

One such combination of driving the long birdcage with a rectangular loop and the combined coils #2 & #3 with a FIG. 8 style loop is shown in FIG. 7b. Again note, two such combinations are needed to drive all four modes of the array (2 homogeneous, 2 RF gradient modes).

Figure 7C:
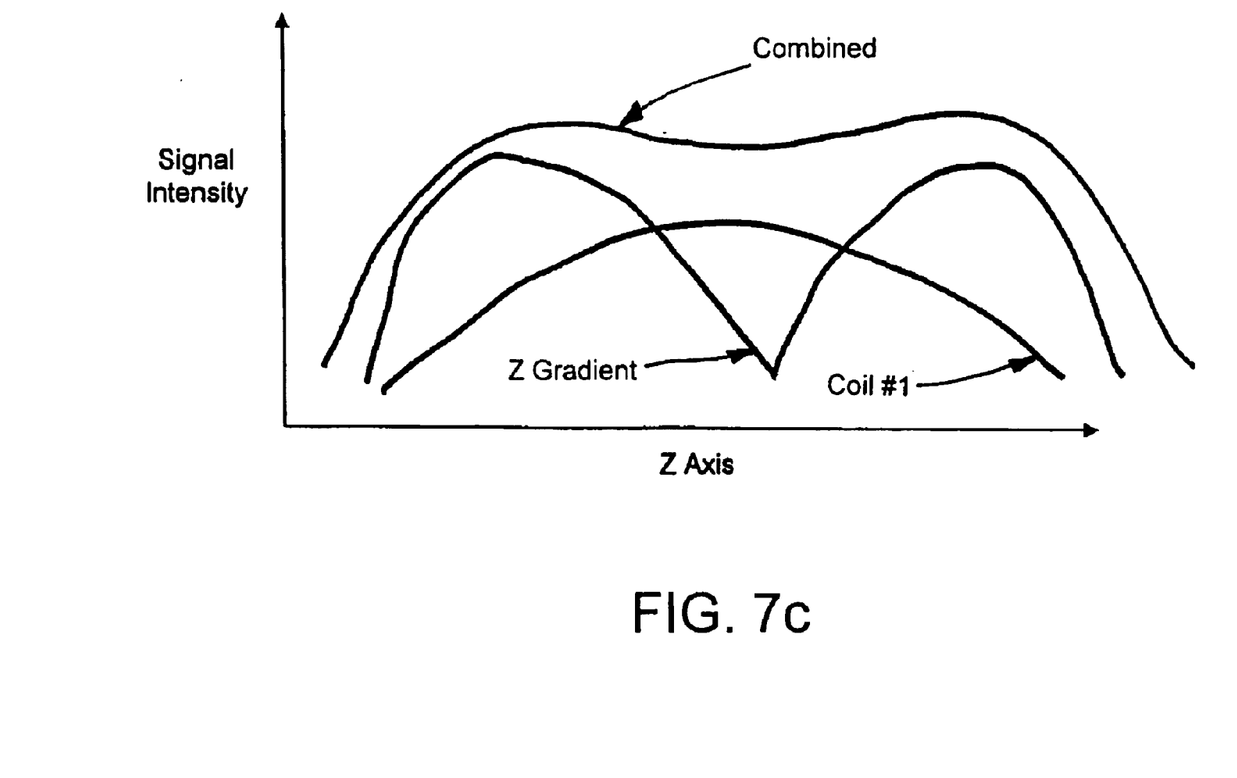
FIG. 7c represents the B field profile of the coil of FIG. 7a along the coil axis.

From FIG. 7c, the homogeneous mode (of longer birdcage #1) along with the Z RF gradient mode (of the combined birdcages #2, #3) provide a high S/N and highly uniform B field profile along the coil axis with very sharp cutoffs (rapid falloff) beyond the imaging FOV. Thus contamination from the neighboring anatomy does not corrupt the image quality. This aspect can be used to build shorter RF coils encompassing the anatomy of interest as opposed to the longer conventional coils routinely build to image the same FOV. Note all of the above can be accomplished without significantly comprising B field uniformity.

One such example is the head coil. Commercial head coil dimensions are 12" in diameter and 12" long coil to image a 24 cm FOV over the brain and the upper c-spine. With the proposed design one can build a head coil 12" in diameter and 9" long to provide uniform coverage over the same 24 cm FOV as opposed to the conventional 12" long coil. With a 9" long coil, signal contributions from the neck, shoulders and upper chest are rarely seen which result in increased S/N due to reduced loading (hence high Q loaded values) less artifacts.

Third Embodiment

Figure 8B:
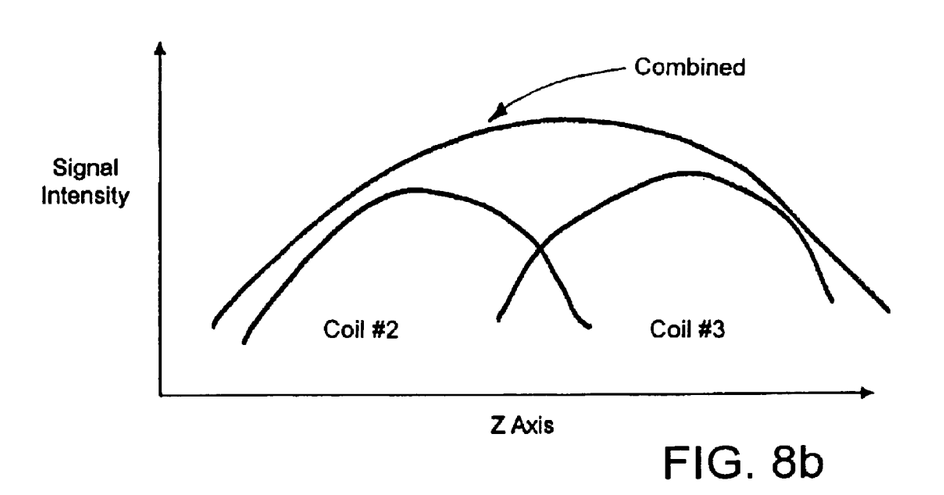
FIG. 8b represents the B field profile of the coil of FIG. 8a along the coil axis.

With reference to FIG. 8a, two short coils #2 & #3 that are electrically connected to one another are driven using inductive coupling loops and their outputs interfaced to separate channels of the receiver system (not shown). Alternatively, capacitive coupling similar to that of Roemer (U.S. Pat. No. 4,887,039) can be used. Note, the two short coils #2 & #3 are tuned to the NMR frequency using C1 and C3. The value of C3 is chosen so as to cancel the net mutual coupling between the two stubby birdcages (#2, #3). B field cartoons along the coil axis are shown in FIG. 8b for the individual stubby coils and their combination.

Other Embodiments

Figure 13:
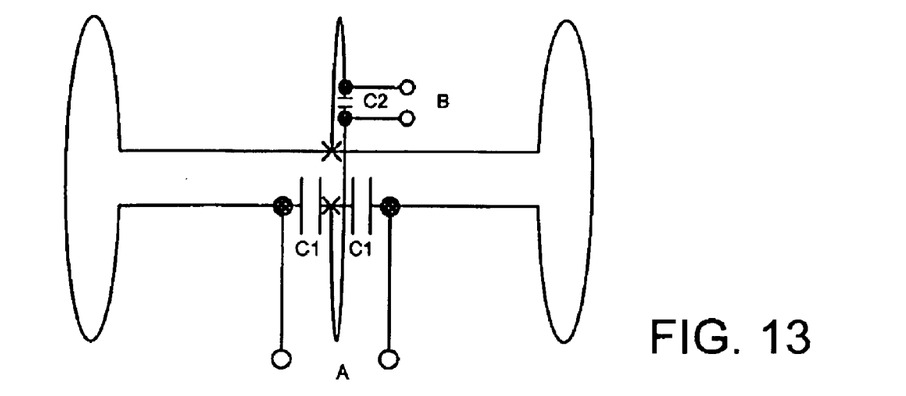
FIG. 13 is a schematic view of a solenoid coil in accordance with the present invention.
Figure 14:
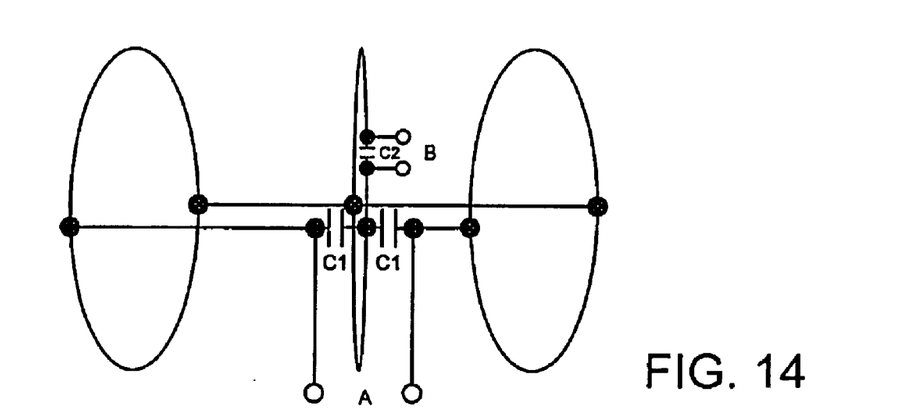
FIG. 14 is a schematic view of an Alderman-Grant type resonator in accordance with the present invention.
Figure 15:
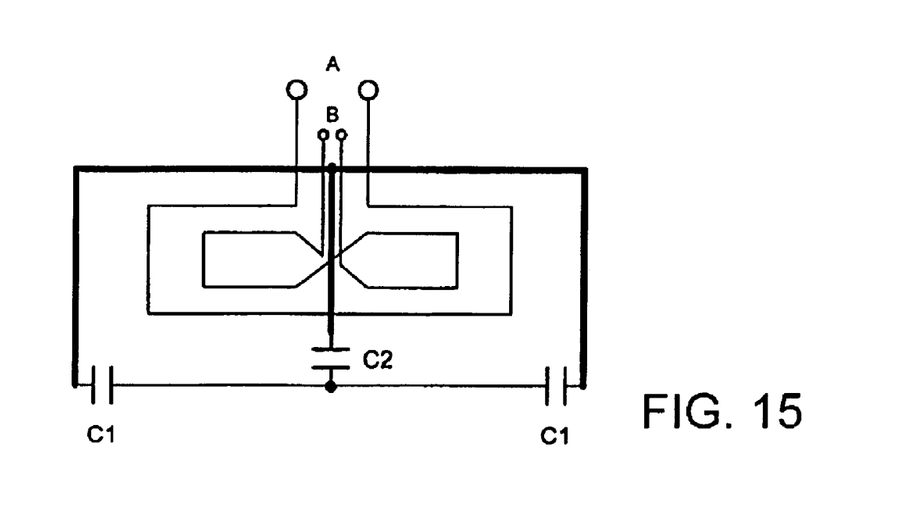
FIG. 15 is a schematic view of a modified cavity section of a TEM resonator in accordance with the present invention.

Generally, the inventive aspects of FIG. 5 are applicable to all volume coil designs (TEM, solenoid, alderman-grant, counter-rotating coil pair etc.). See for example, FIGS. 13-15, which are extensions of the principles to the solenoid, Alderman-Grant and TEM designs, respectively. Irrespective of the design, the coils in an array can be operated in the three preferred operating modes, i.e. all three coils, first and combined second and third coils or second and third coils alone. In all cases, C1 capacitors resonate the homogeneous modes whereas the combination of C1 and C2 together resonate the corresponding RF gradient modes at the respective NMR frequency. One driving mechanism for the solenoid and Alderman-Grant coils in the second preferred mode (homogeneous and RF gradient modes) is shown in FIGS. 13-15, across C1 "A" for the homogeneous and across C2 "B" for the RF gradient modes, respectively. For the TEM however, a rectangular loop (A) and FIG. "8" (B) loop may be used to drive the homogeneous and RF gradient modes, respectively. Note for the above, other coupling/driving mechanisms can be envisioned by others skilled in the art.

Also see, for example, G. Randy Duensing, et al., "A 4-Channel Volume Coil for Vertical Field MRI", Proceedings of International Society of Resonance in Medicine, 8th Scientific Meeting, Apr. 1–7, 2000 Denver, Co., USA. Combinations of a CRC-solenoid and Alderman-Grant type coil-solenoid was disclosed by Duensing et al. See FIGS. 1 and 2 of Alderman, D. W. and Grant, D. M. J. Magn. Reson. 36:447 (1979). The B field along the coil axis and combined S/N are shown on FIGS. 2a and 2b of Duensing et. al., respectively. It is envisaged that other combinations either within a coil design or between coil designs as described above by Duensing et al. are possible and are within the scope of the present application. Combinations within one type of coil design are the use of a TEM homogeneous mode and TEM gradient mode, or use of a homogeneous solenoid mode and a solenoid gradient mode along the coil axis respectively. Likewise, other examples can be quickly realized by anyone skilled in the art.

Figure 9:
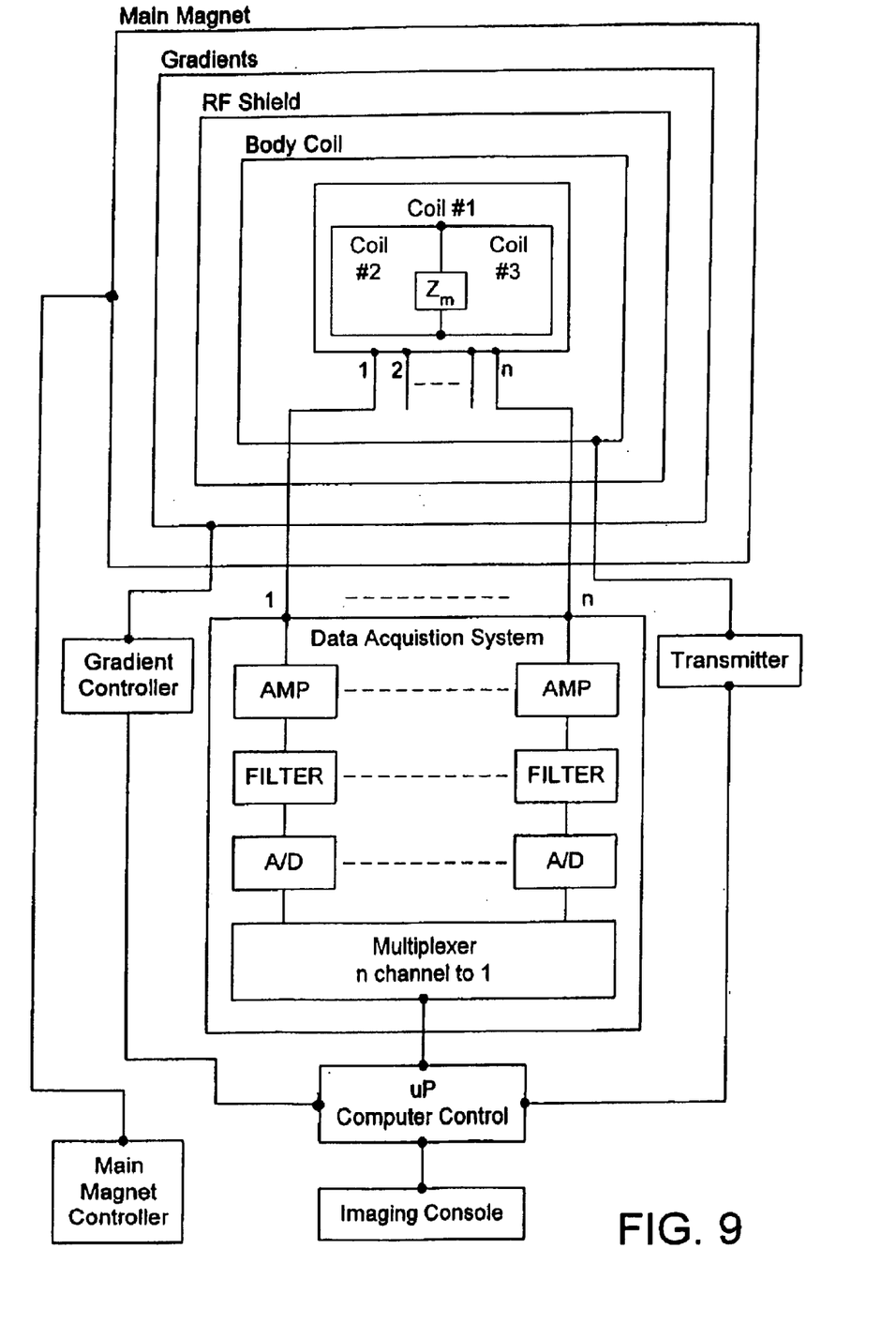
FIG. 9 is a block diagram of a system incorporating a coil in accordance with the present invention.

FIG. 9 is a system block diagram, which illustrates the utility of the RF coil of the present invention in NMR imaging and spectroscopy, for example. The system has a main magnet which covers the time varying gradient coils, an RF shield that isolates the RF coil from the gradient coils and a whole-body RF coil most commonly used for uniform B field transmit over a large imaging FOV. The main magnet strength sets the NMR frequency of operation. The time varying gradient fields help spatially encode the NMR signals. The RF whole body coil is used to transmit, while the local RF coil is used to pick up the NMR signals from the object under investigation (NMR phantom). A number of receiver coils may be used in an array configuration and may be summed either analog or digitally to produce the resultant image. Signals from the several receiver ports may be acquired via one or multiple receiver channels. An n-to-1 channel multiplexer is shown in the drawing. This helps by-pass n channel coil data to use one channel of the NMR system. Alternatively, an n channel NMR system may also be used.

From all of the above information, for someone skilled in the art, it will be apparent that the inventive aspects of FIG. 5 may be adapted to a number of different coil designs (birdcage, TEM, surface loop type, solenoid, etc.) for several resonance techniques, such as NMR, NQR, ESR etc. It will also be apparent that the individual coils in an integrated RF coil system may be tuned to the same or different frequencies.

Again note, the RF coil system of the embodiments are designed to image many anatomical regions of the human body such as the torso, head, knee, wrist, etc. They may have a circular, elliptical or any other cross-section suitable to image the anatomy under investigation. The individual coils in the array may have a eight, four or two fold symmetry. The coils may be driven in linear or quadrature. The RF coil array may be driven in one or more coil modes. The NMR signals may be combined prior to the preamplifier or post the preamplifier in analog or digital fashion. The individual coils in the array may be tuned to one or more frequencies.

It will be apparent to those skilled in the art that the coil designs in the distributed cases may be of the low-pass, high-pass, band-pass or the band-stop configurations. The coils may be of the volume type or surface type. The coils may be used to transmit only, receive only or may be used for transmit and receive purposes. Individual coils in the array may be interfaced to separate channels in the multi-channel resonance system or may be time-multiplexed to one or more channels of a single or multi-channel resonance system. In addition, different tuning/matching/isolation schemes can be realized. Further, the coils are compatible with S/N, resolution enhancing scan time reducing techniques such as, SMASH, SENSE and other techniques, etc.

Although the invention has been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

What is claimed is:

1. An integrated radio-frequency coil array, comprising:
   a first coil spanning a first field of view (FOV);
   a first driving means for driving the first coil to image;
   a second coil spanning a second FOV;
   a second driving means for driving the second coil to image;
   a third coil spanning a third FOV, wherein a combined FOV of the second and third coil is substantially equivalent to the first FOV;
   a third driving means for driving the third coil to image, wherein at least two of the first, second and third coils can driven simultaneously to obtain a combined image and each coil can be drive independently to obtain an image; and
   a first common coil path that includes at least one reactive component, wherein the second and the third coil share the first common coil path without overlap, and the second coil and the third coil adjoin one another without overlap.

2. The coil array of claim 1, wherein the second coil and the third coil are situated such that the first common coil path falls over a central virtual ground plane of the first coil.

3. The coil array of claim 1, wherein the second coil and the third coil are substantially isolated from one another and from the first coil.

4. The coil array of claim 1, wherein the first coil has an imaging field of view (FOV), and the second coil and the third coil combine to span a near identical B field to that of the first coil over the imaging FOV.

5. The coil array of claim 1, wherein the second coil and the third coil are a subset of the first coil.

6. The coil array of claim 1, wherein the second coil and the third coil have substantially the same dimensions.

7. The coil array of claim 1, wherein each coil is driven simultaneously to obtain an independent image.

8. The coil array of claim 1, wherein each coil is driven individual to obtain an independent image.

9. The coil array of claim 1, wherein the reactive components are chosen to cancel the coupling between the second coil and the third coil.

10. The coil array of claim 1,
wherein the first driving means includes a first inductive coupling loop coupled to the first coil, the second driving means includes a second inductive coupling loop coupled to the second coil, and the third driving means includes a third inductive coupling loop coupled to the third coil, and
wherein the second inductive coupling loop of the second driving means and the third inductive coupling loop of the third driving means are overlapped to cancel a net mutual flux between the second inductive coupling loop of the second driving means and the third inductive coupling loop of the third driving means.

11. The coil array of claim 1, wherein the second coil and the third coil are situated symmetrically within the first coil.

12. The coil array of claim 1, wherein the first coil, the second coil and the third coil image simultaneously, independent of each other.

13. The coil array of claim 1, wherein the first coil and a combination of the second coil and the third coil image simultaneously.

14. The coil array of claim 1, wherein the second coil and the third coil image simultaneously.

15. The coil array of claim 1, wherein the first driving means is a rectangular loop and the second and third driving means are combined into a figure eight loop.

16. The coil array of claim 1, wherein the coil array design is selected from the group consisting of a birdcage, a solenoid, an Alderman-Grant resonator, a transverse electromagnetic wave (TEM) resonator, a saddle, a counter rotating coil CRC pair, a Helmholtz pair, a surface loop coil, and a surface coil.

17. The coil array of claim 1, wherein the first coil, the second coil and the third coil are configured from the group consisting of a high-pass configuration, a low-pass configuration, a band-pass configuration and a band-stop configuration.

18. The coil array of claim 1, wherein the first coil, the second coil and the third coil are volume type coils.

19. The coil array of claim 1, wherein the first coil, the second coil and the third coil are surface type coils.

20. The coil array of claim 1, wherein
the first coil is a first long birdcage comprising a first ring interconnected to a second ring,
the second coil is a second short birdcage located relative to the first long birdcage, comprising the first ring interconnected to the central ring, and
the third coil is a third short birdcage located relative to the first long birdcage and the second short birdcage, comprising the central ring interconnected to the third ring.

21. The coil array of claim 20, wherein a k–1 linear mode of the second short birdcage and the third short birdcage is tuned and matched to about 50 ohms at the nuclear magnetic resonance (NMR) frequency, and the k–1 linear mode of the first long birdcage is tuned to the NMR frequency.

22. The coil array of claim 20, wherein the second short birdcage and the third short birdcage are isolated from the first long birdcage when the second short birdcage and the third short birdcage are driven with currents of equal amplitudes 180 degrees out of phase.

23. The coil array of claim 20, wherein the second short birdcage and the third short birdcage have substantially the same dimensions.

24. The coil array of claim 23, wherein the second short birdcage and the third short birdcage are about one half the length of the first long birdcage.

25. The coil array of claim 20, wherein the central ring is decoupled with respect to the first long birdcage.

26. The coil array of claim 20, wherein the first long birdcage, the second short birdcage and the third short birdcage are in a high pass configuration.

27. The coil array of claim 20, wherein the coil array is a volume type coil and a final image produced by the coil array includes a combination of a homogenous mode produced by the first large birdcage and an RF gradient mode produced by the second small birdcage and the third small birdcage.

28. The coil array of claim 20, wherein the first long birdcage is driven by a coupling method selected from the group consisting of inductive coupling and capacitive coupling.

29. The coil array of claim 28, wherein the first long birdcage is driven by a rectangular loop and the combined second small birdcage and third small birdcage is driven by a figure eight loop.

30. The coil array of claim 28, wherein a homogenous mode produced by the first long birdcage and a radio frequency gradient mode produced by the combined second small birdcage and third small birdcage is combined along a coil axis.

31. The coil array of claim 20 wherein an RF gradient mode is generated along a coil axis of a combined second small birdcage and third small birdcage.

32. The coil array of claim 31 wherein the RF gradient mode is in quadrature.

33. The coil array of claim 31 wherein the RF gradient mode comprises two linear RF gradient modes orthogonal to one another.

34. A resonance imaging/analysis system, comprising:
a coil array as described in claim 1; and
a means for processing RF signals which are at least one of received from the coil array and transmitted from the coil array in order to obtain a resonance image/analysis.

35. The coil array of claim 1, wherein the first driving means is selected from the group consisting of inductive coupling and capacitive coupling.

36. The coil array of claim 35, wherein the second and third coil are driven across the active component.

* * * * *